US012804817B2

(12) United States Patent
Lin et al.

(10) Patent No.: US 12,804,817 B2
(45) Date of Patent: Nov. 17, 2026

(54) CIRCUIT BOARD AND MANUFACTURING METHOD THEREOF

(71) Applicants: Avary Holding (Shenzhen) Co., Ltd., Shenzhen (CN); HongQiSheng Precision Electronics (QinHuangdao) Co., Ltd., Hebei Province (CN); Garuda Technology Co., Ltd., New Taipei City (TW)

(72) Inventors: Yuan-Yu Lin, Hebei Province (CN); Jia-Hui Wang, Hebei Province (CN)

(73) Assignees: Avary Holding (Shenzhen) Co., Ltd., Shenzhen (CN); HongQiSheng Precision Electronics (QinHuangdao) Co., Ltd., Hebei Province (CN); Garuda Technology Co., Ltd., New Taipei City (TW)

( * ) Notice: Subject to any disclaimer, the term of this patent is extended or adjusted under 35 U.S.C. 154(b) by 201 days.

(21) Appl. No.: 18/958,736

(22) Filed: Nov. 25, 2024

(65) Prior Publication Data

US 2026/0150197 A1 May 28, 2026

(51) Int. Cl.
*H05K 1/18* (2026.01)
*H05K 1/02* (2006.01)
*H05K 1/14* (2006.01)
*H05K 1/184* (2026.01)
*H05K 3/36* (2006.01)

(52) U.S. Cl.
CPC ........... *H05K 1/144* (2013.01); *H05K 1/0233* (2013.01); *H05K 1/184* (2013.01); *H05K 3/368* (2013.01); *H05K 2201/083* (2013.01); *H05K 2201/10378* (2013.01); *H05K 2203/104* (2013.01)

(58) Field of Classification Search
CPC ...... H05K 1/144; H05K 1/0233; H05K 1/184; H05K 3/368; H05K 2201/083; H05K 2201/10378; H05K 2203/104
USPC .......................................................... 361/803
See application file for complete search history.

(56) References Cited

U.S. PATENT DOCUMENTS 10,896,877 B1 * 1/2021 Yang ..................... H10W 20/42
2014/0293480 A1 * 10/2014 Le ...................... G11B 17/0284
360/98.08

(Continued)

FOREIGN PATENT DOCUMENTS

CN 205283942 U 6/2016
CN 112153813 B 11/2021

(Continued)

*Primary Examiner* — Binh B Tran

(74) *Attorney, Agent, or Firm* — MUNCY, GEISSLER, OLDS & LOWE, P.C.

(57) ABSTRACT

A circuit board includes a first circuit base board, a second circuit base board, an annular interposer disposed between the first circuit base board and the second circuit base board, and a conductive element. A first annular groove of the first circuit base board has a first internal extension groove. A second annular groove of the second circuit base board has a second internal extension groove. The annular interposer is located in the first annular groove and the second annular groove. The conductive element is disposed in the first internal extension groove and the second internal extension groove and electrically connects the first conductive layer and the second conductive layer.

16 Claims, 5 Drawing Sheets

(56) References Cited

U.S. PATENT DOCUMENTS

2014/0293484 A1* 10/2014 Le ...................... G11B 17/0287
360/99.12
2024/0128142 A1* 4/2024 Liu ....................... H10W 72/20

FOREIGN PATENT DOCUMENTS

TW 201729361 A 8/2017
TW 202312383 A 3/2023

* cited by examiner

10

CIRCUIT BOARD AND MANUFACTURING METHOD THEREOF

BACKGROUND

Field of Invention

The present disclosure relates to a circuit board and a manufacturing method of the circuit board. More particularly, the present disclosure relates to the circuit board that electrically connects different circuit base boards through a conductive element and their manufacturing method.

Description of Related Art

As the performance of smart phones becomes stronger and stronger, the number of components in the smart phone is also increasing. Therefore, how to incorporate more components and/or a larger battery within the limited space of smart phones has become an important issue. It is known that an interposer is disposed between an upper circuit base board and a lower circuit base board to electrically connect the two circuit base boards. The traditional interposer is installed between two circuit base boards by welding. However, this arrangement of the interposer could easily cause poor alignment, which affects the electrical connection between the interposer and the circuit base boards, resulting in a decrease in a yield of the circuit board and making it difficult to disassemble, repair, or replace the circuit base boards and the interposer. In view of the above, there is an urgent need to develop a circuit board and a manufacturing method thereof to overcome the above disadvantages.

SUMMARY

The circuit board of the present disclosure has a snap-on connection structure. An annular interposer and a conductive element are disposed in a first annular groove of a first circuit base board and a second annular groove of a second circuit base board. Through the conductive element, a first conductive layer, and a second conductive layer, the first circuit base board electrically connects to the second circuit base board. The circuit board of the present disclosure can effectively reduce the problem of reduced circuit board yield due to poor alignment of a traditional circuit board, thereby reducing the production cost of the circuit board. The circuit board of the present disclosure can also reduce an overall thickness of the traditional circuit board, which is beneficial to miniaturization and thinning of the electronic device (such as, a smart phone). Compared with the circuit board formed by traditional welding methods, the circuit board of the present disclosure has the advantages of being easy to disassemble, repair, and replace the circuit base board and/or the annular interposer due to its snap-on design.

The manufacturing method of a circuit board of the present disclosure includes forming an annular interposer, in which the annular interposer is formed by bending wiring recesses in a wiring base board. Sidewalls of the annular interposer can be selectively disposed with one or more electronic components to improve the performance of the circuit board, and miniaturization and increase the functionality of the electronic device.

One aspect of the present disclosure is to provide a circuit board, a first circuit base board, a second circuit base board, an annular interposer, and a conductive element. The first circuit base board includes a first interior region, a first annular groove, and at least one first conductive layer. The first annular groove surrounds the first interior region, in which the first annular groove has a plurality of first internal extension grooves extending toward the first interior region. The first conductive layer is disposed on a bottom surface and a sidewall of at least one of the plurality of first internal extension grooves. The second circuit base board includes a second interior region, a second annular groove, and at least one second conductive layer. The second annular groove surrounds the second interior region, in which the second annular groove has a plurality of second internal extension grooves extending toward the second interior region. The second conductive layer is disposed on a bottom surface and a sidewall of at least one of the plurality of second internal extension grooves. The annular interposer is disposed between the first circuit base board and the second circuit base board and located in the first annular groove and the second annular groove. The conductive element is disposed in one of the plurality of first internal extension grooves and one of the plurality of second internal extension grooves, in which the conductive element electrically connects to the first conductive layer and the second conductive layer.

In at least one embodiment of the present disclosure, the first circuit base board further includes a magnet, the first interior region includes a first recess, and the magnet is disposed in the first recess.

In at least one embodiment of the present disclosure, the magnet is a permanent magnet.

In at least one embodiment of the present disclosure, the first circuit base board further includes a shielding material, and the shielding material is disposed between the first recess and the magnet.

In at least one embodiment of the present disclosure, the shielding material includes a ferromagnetic material or a ferrimagnetic material.

In at least one embodiment of the present disclosure, the second circuit base board further includes a magnetically attractive body, the second interior region includes a second recess, the magnetically attractive body is disposed in the second recess, and the magnet and the magnetically attractive body are arranged opposite to each other, in which a magnetic force is generated between the magnet and the magnetically attractive body to attract each other.

In at least one embodiment of the present disclosure, the magnetically attractive body is a permanent magnet or includes a ferromagnetic material or a ferrimagnetic magnetic material that is not spontaneously magnetized.

In at least one embodiment of the present disclosure, the first circuit base board further includes a first exterior region surrounding the first interior region and the first annular groove, the second circuit base board further includes a second exterior region surrounding the second interior region and the second annular groove. The first annular groove has a plurality of first external extension grooves extending toward the first exterior region, and the second annular groove has a plurality of second external extension grooves extending toward the second exterior region.

In at least one embodiment of the present disclosure, the annular interposer has an inner surface surrounding the first interior region and the second interior region, and the first exterior region and the second exterior region surround the inner surface. The circuit board further includes a plurality of interior electronic components, and the plurality of interior electronic components are disposed in the plurality of first internal extension grooves and the plurality of second internal extension grooves.

In at least one embodiment of the present disclosure, the annular interposer further has an outer surface surrounding the inner surface, and the first exterior region and the second exterior region surround the outer surface. The circuit board further includes a plurality of exterior electronic components, and the plurality of exterior electronic components are disposed in the plurality of first external extension grooves and the plurality of second external extension grooves.

In at least one embodiment of the present disclosure, the first interior region of the first circuit base board, the second interior region of the second circuit base board, and the inner surface of the annular interposer form a cavity.

One aspect of the present disclosure is to provide manufacturing method of a circuit board. The manufacturing method includes the following steps. The above-mentioned first circuit base board is provided. The above-mentioned second circuit base board is provided. An annular interposer is formed. The annular interposer is placed between the first circuit base board and the second circuit base board, so that the conductive element is disposed in one of the plurality of first internal extension grooves and one of the plurality of second internal extension grooves, in which the conductive element electrically connects to the first conductive layer and the second conductive layer. Forming the annular interposer includes the following steps. A wiring base board is provided, in which the wiring base board has a first surface and a second surface opposite to the first surface. A conductive element is disposed on the first surface. A portion of the wiring base board is recessed from the first surface to form a plurality of wiring recesses. The plurality of wiring recesses are bended, so that the wiring base board forms the annular interposer, in which the first surface forms an inner surface, the second surface forms an outer surface, and the outer surface surrounds the inner surface In at least one embodiment of the present disclosure, forming the annular interposer further includes the following steps. A plurality of interior electronic components is disposed on the first surface. A plurality of exterior electronic components is disposed on the second surface.

In at least one embodiment of the present disclosure, the first circuit base board further includes a magnet, the first interior region includes a first recess, and the magnet is disposed in the first recess.

In at least one embodiment of the present disclosure, the first circuit base board further includes a shielding material, and the shielding material is disposed between the first recess and the magnet.

In at least one embodiment of the present disclosure, the second circuit base board further includes a magnetically attractive body, the second interior region includes a second recess, the magnetically attractive body is disposed in the second recess, and the magnet and the magnetically attractive body are arranged opposite to each other, wherein a magnetic force is generated between the magnet and the magnetically attractive body to attract each other.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
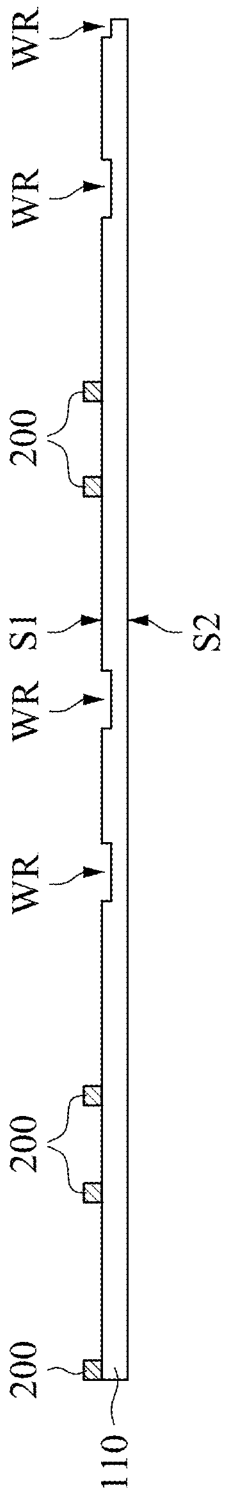
FIG. 1 and FIG. 2 are cross-sectional views for an annular interposer at various stages in accordance with some embodiments of the present disclosure.

In the following text, in order to clearly present technical features of the present application, the dimensions (for example, lengths, widths, thicknesses and depths) of components (for example, wiring base boards, conductive layers and grooves, etc.) in the drawings may be scaled in unequal proportions, and the number of some components may be reduced. Therefore, the description and explanation of the following embodiments are not limited to the number of components in the drawings and the size and shape of the components, but should cover the deviations in sizes, shapes and both caused by actual manufacturing processes and/or tolerances. For example, flat surfaces shown in the drawings may have rough and/or non-linear features, while acute angles shown in the drawings may be rounded. Therefore, the components shown in the drawings of the present application are mainly for illustration and are not intended to accurately depict the actual shapes of the components, nor are used to limit the scope of the patent application of the present disclosure.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. That is, when the device is oriented differently from the drawings (rotated 90 degrees or at other orientations), the spatially relative terms used in the present disclosure may also be interpreted accordingly.

It will be understood that, although the terms “first”, “second”, etc. may be used herein to describe various components, these components should not be limited by these terms. These terms are only used to distinguish one component from another. For example, a first component could be referred to as a second component, and similarly, a second component could be referred to as a first component, without departing from the scope of the embodiments. As used herein, the term “and/or” includes any and all combinations of one or more of related listed items.

Figure 2:
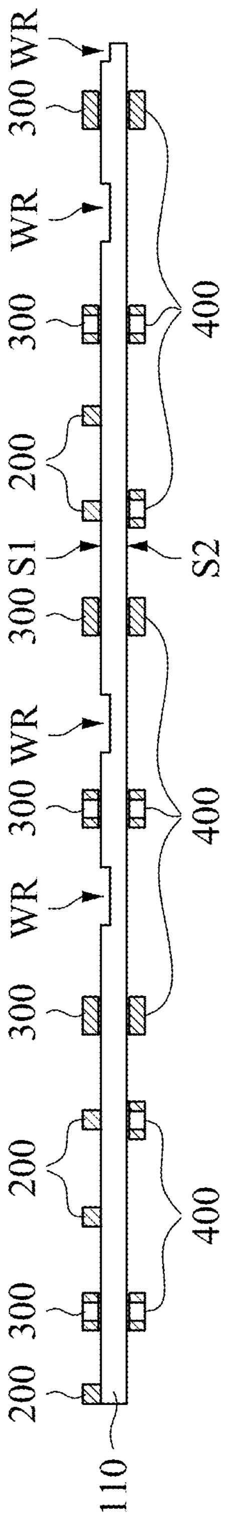

FIG. 1 and FIG. 2 are cross-sectional views for an annular interposer 100 (referring to FIG. 3) at various stages in accordance with some embodiments of the present disclosure. Referring to FIG. 1, in the manufacturing process of the annular interposer 100, firstly, a wiring base board 110 is provided. The wiring base board 110 has a first surface S1 and a second surface S2 opposite to the first surface S1. It can be understood that the wiring base board 110 includes a plurality of wiring layers (not shown) and a plurality of insulation layers (not shown), and the plurality of wiring layers and the plurality of insulation layers can be pressed together to form a stacked structure.

As shown in FIG. 1, a plurality of conductive elements 200 is disposed on the first surface S1, and the first surface S1 has a plurality of wiring recesses WR, in which each conductive element 200 separates from each wiring recess WR. Specifically, the plurality of wiring recesses WR is formed by recessing a portion of wiring base board 110 from the first surface S1, in which the conductive elements 200 are not disposed in any wiring recesses WR. It is worth noting that, as shown in FIG. 1, a right end of the wiring base board 110 has one wiring recess WR, and a left end of the wiring base board 110 has one conductive element 200. The wiring recess WR at the right end serves as a mortise of the annular interposer 100 (referring to FIG. 3), and the conductive element 200 at the left end serves as a tenon of the annular interposer 100 (referring to FIG. 3).

In some examples, the wiring recess WR may be formed by routing of laser ablation. In some examples, the conductive element 200 may be, for example, a copper pad. The wiring recesses WR of the wiring base board 110 can provide flexibility (bendability) to the wiring base board 110 to facilitate subsequent bending of the wiring base board 110 from the wiring recesses WR, thereby forming the annular interposer 100 shown in FIG. 3.

Then, referring to FIG. 2, a plurality of interior electronic components 300 is disposed on the first surface S1, and a plurality of exterior electronic components 400 is disposed on second surface S2. In some examples, the interior electronic components 300 and the exterior electronic components 400 may be, for example, resistors, capacitors, or semiconductor components, but are not limited thereto.

Figure 3:
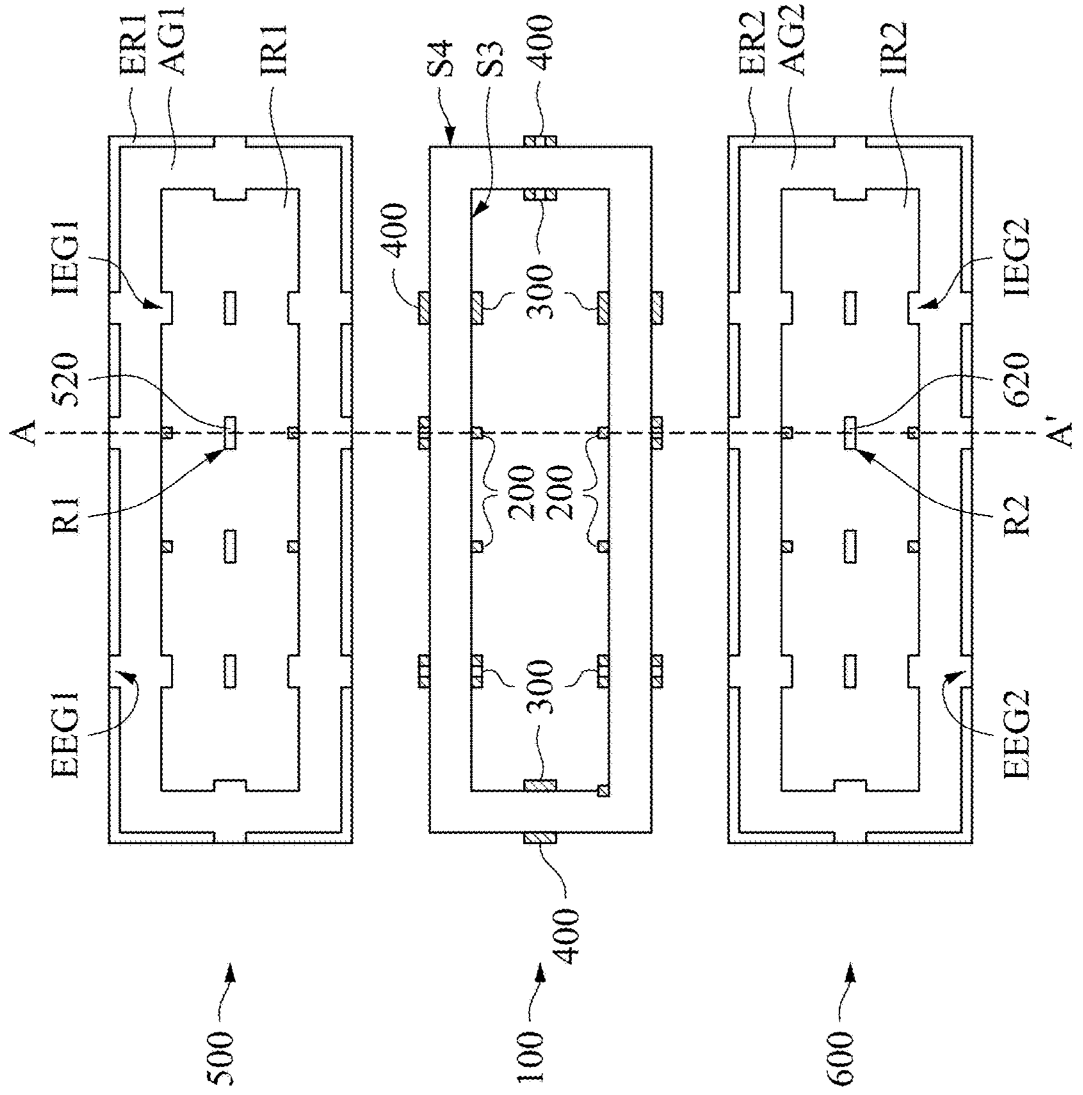
FIG. 3 is a plan view of a circuit board in accordance with some embodiments of the present disclosure.

FIG. 3 is a plan view of a circuit board 10 in accordance with some embodiments of the present disclosure. Referring to FIG. 2 and FIG. 3, the circuit board 10 includes a first circuit base board 500, a second circuit base board 600, the annular interposer 100, the conductive elements 200, the interior electronic components 300, and the exterior electronic components 400. After the structure shown in FIG. 2 is formed, the plurality of wiring recesses WR are bend, in which the wiring recess WR at the right end of FIG. 2 is joined to the conductive element 200 at the left end of FIG. 2, so that the wiring base board 110 forms the annular interposer 100 shown in FIG. 3.

The annular interposer 100 has an inner surface S3 and an outer surface S4, in which the first surface S1 forms the inner surface S3, and the second surface S2 forms the outer surface S4. The outer surface S4 surrounds the inner surface S3, as shown in FIG. 3. It can be understood that the inner surface S3 is a continuous surface, and the outer surface S4 also is a continuous surface. Therefore, in the examples of FIG. 3, the plurality of interior electronic components 300 is disposed on the inner surface S3, and the plurality of exterior electronic components 400 is disposed on the outer surface S4.

Figure 4:
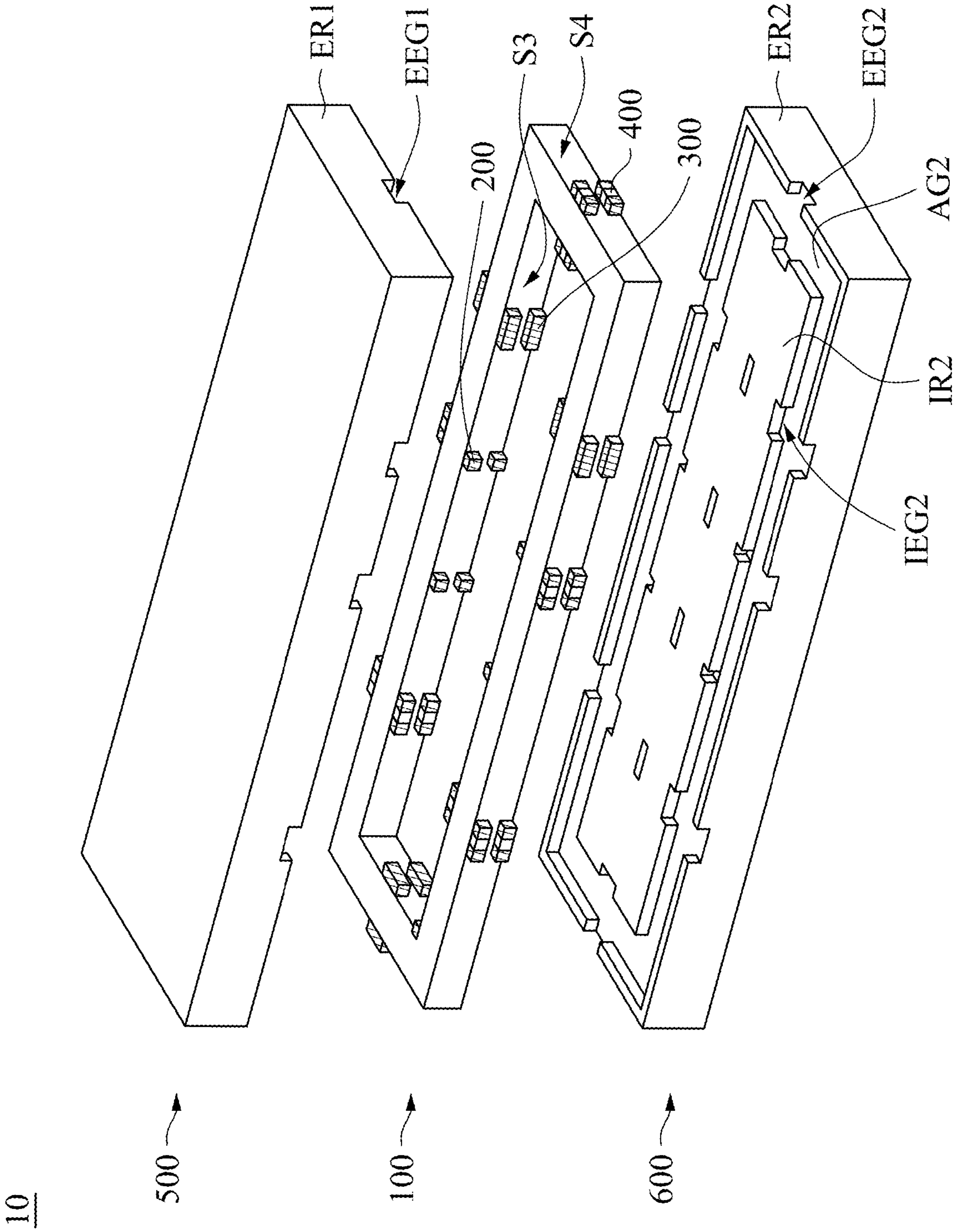
FIG. 4 is a three dimensional view of the circuit board in FIG. 3.

FIG. 4 is a three dimensional view of the circuit board 10 in FIG. 3. It can be understood that the first circuit base board 500 includes a plurality of wiring layers and a plurality of insulation layers, and the plurality of wiring layers and the plurality of insulation layers can be pressed together to form a stacked structure. The second circuit base board 600 also includes a plurality of wiring layers and a plurality of insulation layers, and the plurality of wiring layers and the plurality of insulation layers can be pressed together to form a stacked structure.

Referring to FIG. 3 and FIG. 4, the first circuit base board 500 includes a first interior region IR1, a first annular groove AG1, and a first exterior region ER1. The first annular groove AG1 surrounds the first interior region IR1, and the first exterior region ER1 surrounds the first interior region IR1 and the first annular groove AG1. In other words, the first annular groove AG1 is located between the first interior region IR1 and the first exterior region ER1.

As shown in the first circuit base board 500 of FIG. 3, the first annular groove AG1 has a plurality of first internal extension grooves IEG1 extending toward the first interior region IR1. The first annular groove AG1 further has a plurality of first external extension grooves EEG1 extending toward the first exterior region ER1. In other words, the plurality of first internal extension grooves IEG1, the plurality of first external extension grooves EEG1 and the first annular groove AG1 are connected with each other.

The second circuit base board 600 has a similar structure to the first circuit base board 500. Specifically, the second circuit base board 600 includes a second interior region IR2, a second annular groove AG2, and a second exterior region ER2. The second annular groove AG2 surrounds the second interior region IR2, and the second exterior region ER2 surrounds the second interior region IR2 and the second annular groove AG2. In other words, the second annular groove AG2 is located between the second interior region IR2 and the second exterior region ER2.

As shown in the second circuit base board 600 of FIG. 3 and FIG. 4, the second annular groove AG2 has a plurality of second internal extension grooves IEG2 extending toward the second interior region IR2. The second annular groove AG2 further has a plurality of second external extension grooves EEG2 extending toward the second exterior region ER2. In other words, the plurality of second internal extension grooves IEG2, the plurality of second external extension grooves EEG2, and the second annular groove AG2 are connected with each other.

In the examples of the present disclosure, referring to FIG. 3, the first internal extension grooves IEG1, the first external extension grooves EEG1, the second internal extension grooves IEG2, and the second external extension grooves EEG2 reserve positions for the conductive elements 200, the interior electronic components 300, and the exterior electronic component 400. Thar is, the conductive elements 200, the interior electronic components 300, and the exterior electronic components 400 are disposed in the first internal extension grooves IEG1, the first external extension grooves EEG1, the second internal extension grooves IEG2, and the second external extension groove EEG2, so as to reduce an overall thickness of the circuit board 10 and realize the thinned circuit board 10.

Figure 5:
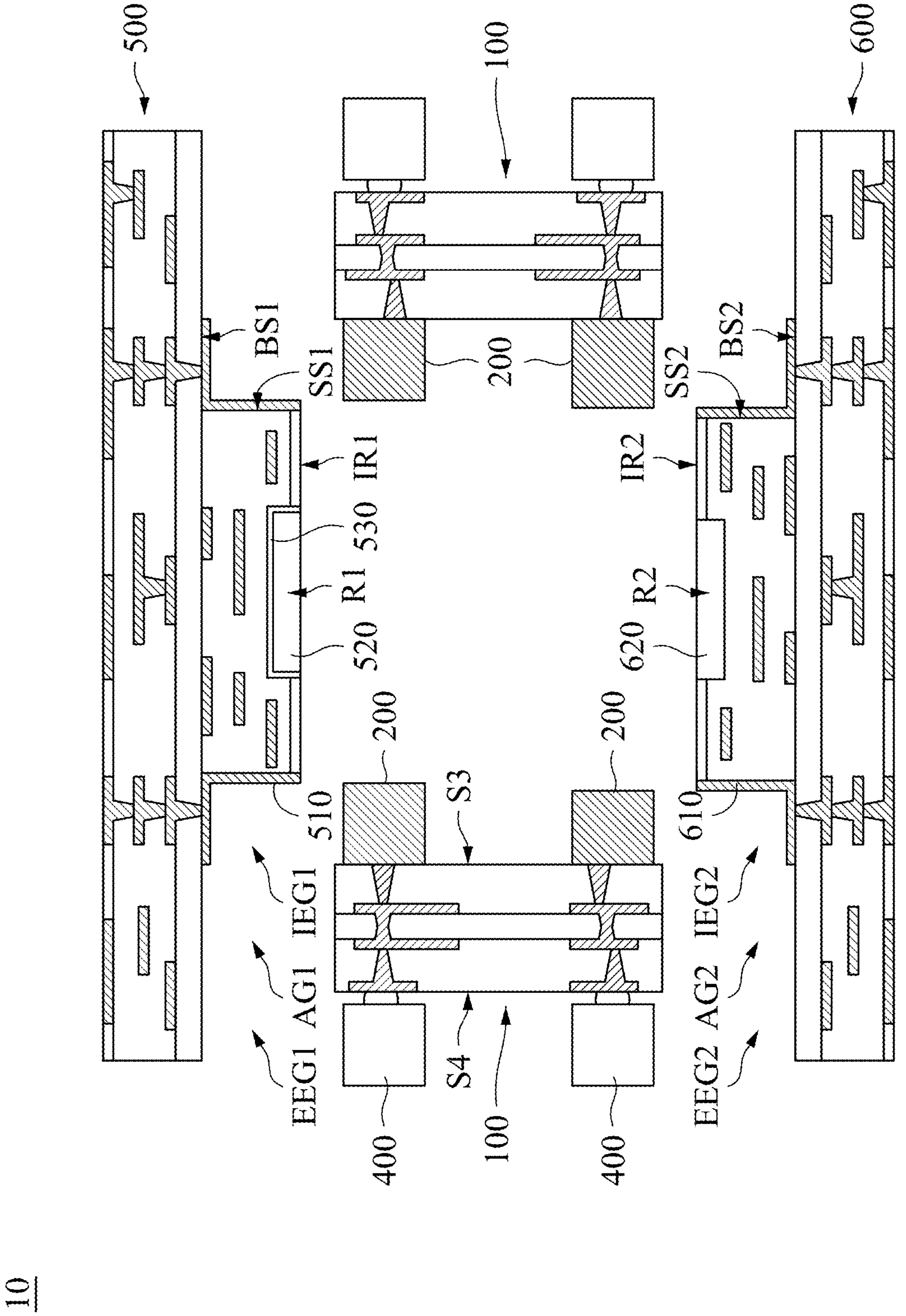
FIG. 5 is a partial cross-sectional view of the circuit board in FIG. 4 before stacking.

FIG. 5 is a partial cross-sectional view of the circuit board 10 in FIG. 4 before stacking. Specifically, FIG. 5 is a cross-sectional view along a line A-A' in FIG. 3 before stacking the first circuit base board 500, the annular interposer 100, and the second circuit base board 600.

Referring to FIG. 3 and FIG. 5, the first interior region IR1 of the first circuit base board 500 further includes a first recess R1, the first circuit base board 500 further includes a magnet 520, and the magnet 520 is disposed in the first recess R1. In other words, the magnet 520 is embedded in the first interior region IR1. The magnet 520 may be a permanent magnet, and may include a ferromagnetic material or a ferrimagnetic material, for example, metals such as iron, cobalt, or nickel, or ceramic materials such as iron oxide.

In the examples of FIG. 5, the first circuit base board 500 further includes a shielding material 530, and the shielding material 530 is disposed between the first recess R1 and the magnet 520. The shielding material 530 is used to reduce the influence of magnetic field on the circuit board 10, and the shielding material 530 may include a ferromagnetic material or a ferrimagnetic material.

Referring to FIG. 3 and FIG. 5, the second interior region IR2 of the second circuit base board 600 further includes a second recess R2, the second circuit base board 600 further includes a magnetically attractive body 620, the magnetically attractive body 620 is disposed in the second recess R2. In other words, the magnetically attractive body 620 is embedded in the second interior region IR2. The magnetically attractive body 620 may be a ferromagnetic material or a ferrimagnetic material, for example, metals such as iron, cobalt, or nickel. As shown in FIG. 5, the magnet 520 is disposed opposite to the magnetically attractive body 620, and a magnetic force is generated between the magnet 520 and the magnetically attractive body 620 to attract each other. Furthermore, the magnetically attractive body 620 may be a permanent magnet or include a ferromagnetic material or a ferrimagnetic magnetic material that is not spontaneously magnetized.

Referring to FIG. 5, the first circuit base board 500 further includes a first conductive layer 510, in which the first conductive layer 510 is disposed on a bottom surface BS1 and a sidewall SS1 of at least one of the plurality of first internal extension grooves IEG1. The second circuit base board 600 further includes a second conductive layer 610, in which the second conductive layer 610 is disposed on a bottom surface BS2 and a sidewall SS2 of at least one of the plurality of second internal extension grooves IEG2. In some examples, the first conductive layer 510 and the second conductive layer 610 may be formed by using a plating through hole (PTH) process, but are not limited thereto. In some examples, the first conductive layer 510 and the second conductive layer 610 are copper pads.

A manufacturing method of the circuit board 10 provided by at least one embodiment of the present disclosure includes the following steps. Referring to FIG. 3 to FIG. 6, the first circuit base board 500 and the second circuit base board 600 shown in FIG. 3 and FIG. 4 are provided, the annular interposer 100 shown in FIG. 3 and FIG. 4 is provided, and the annular interposer 100 is placed between the first circuit base board 500 and the second circuit base board 600.

Figure 6:
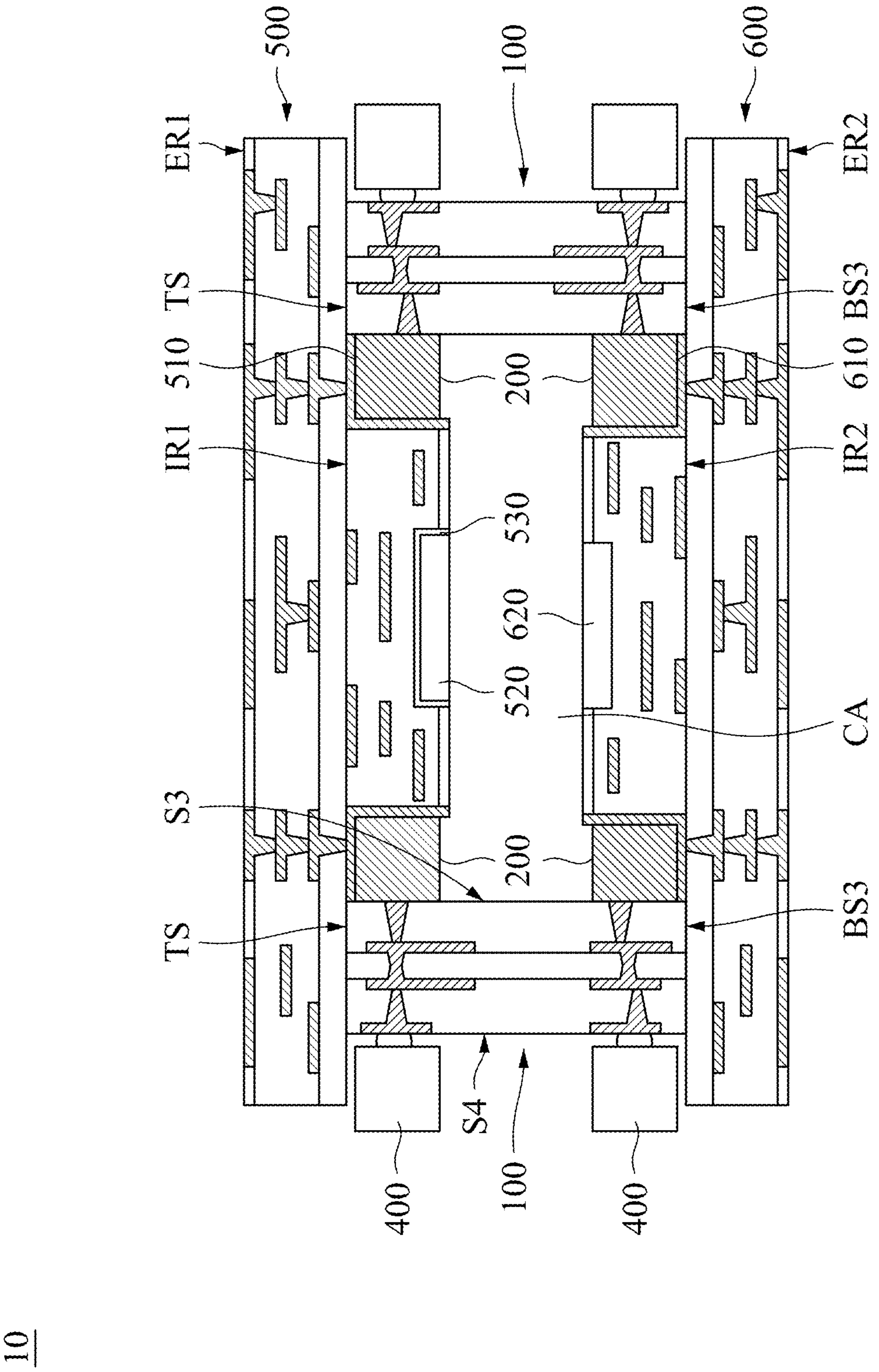
FIG. 6 is a partial cross-sectional view of the circuit board in FIG. 4 after stacking.

FIG. 6 is a partial cross-sectional view of the circuit board 10 in FIG. 4 after stacking. Specifically, FIG. 6 is a cross-sectional view along a line A-A' in FIG. 3 after stacking the first circuit base board 500, the annular interposer 100, and the second circuit base board 600. Referring to FIG. 6, the circuit board 10 includes the first circuit base board 500, the second circuit base board 600, the annular interposer 100, and the conductive element 200. The annular interposer 100 is disposed between the first circuit base board 500 and the second circuit base board 600, and located in the first annular groove AG1 (referring to FIG. 3 and FIG. 5) and the second annular groove AG2 (referring to FIG. 3 to FIG. 5).

Each conductive element 200 is disposed in one of the plurality of first internal extension grooves IEG1 (referring to FIG. 3 and FIG. 5) and one of the plurality of second internal extension grooves IEG2 (referring to FIG. 3 to FIG. 5). Each conductive element 200 electrically connects to the first conductive layer 510 and the second conductive layer 610. In other words, through the first conductive layer 510 and the second conductive layer 610, the plurality of conductive elements 200 electrically connects to the first circuit base board 500 and the second circuit base board 600.

It can be understood that the magnet 520 and the magnetically attractive body 620 are arranged opposite to each other, and a magnetic force is generated between the magnet 520 and the magnetically attractive body 620 to attract each other, therefore, the annular interposer 100 is fixed to the first circuit base board 500 and the second circuit base board 600 through the magnetic force.

As shown in FIG. 6, the annular interposer 100 has the inner surface S3 surrounding the first interior region IR1 and the second interior region IR2. It can be understood that, after stacking the circuit board 10 as shown in FIG. 4, since the exterior electronic components 400 are located in the plurality of first external extension grooves EEG1 (referring to FIG. 3 and FIG. 5) and the plurality of second external extension grooves EEG2 (referring to FIG. 3 and FIG. 5), the first exterior region ER1 and the second exterior region ER2 surround the outer surface S4 and inner surface S3.

In the example of FIG. 6, a top surface TS of the annular interposer 100 contacts a bottom surface of the first annular groove AG1 (referring to FIG. 3 and FIG. 5), and a bottom surface BS3 of the annular interposer 100 contacts a bottom surface of the second annular groove AG2 (referring to FIG. 3 to FIG. 5).

Referring to FIG. 3 and FIG. 4, it can be understood that, after stacking the circuit board 10 as shown in FIG. 4, the plurality of interior electronic components 300 will be located in the plurality of first internal extension grooves IEG1 and the plurality of second internal extension grooves IEG2, and the plurality of exterior electronic components 400 will be located in the plurality of first external extension grooves EEG1 and the plurality of second external extension grooves EEG2.

In the example of FIG. 6, the first interior region IR1 of the first circuit base board 500, the second interior region IR2 of the second circuit base board 600, and the inner surface S3 of the annular interposer 100 form a cavity CA.

Based on the above, the snap-on circuit board (that is, the annular interposer and the conductive element are disposed in the first annular groove of the first circuit base board and the second annular groove of the second circuit base board; through the conductive element, the first conductive layer, and the second conductive layer, the first circuit base board electrically connects to the second circuit base board) of the present disclosure can effectively reduce the problem of reduced circuit board yield due to poor alignment of the traditional circuit board, thereby reducing the production cost of the circuit board.

In addition, because the plurality of electronic components (i.e., the interior electronic components 300 and the exterior electronic components 400) is disposed in the extension grooves (i.e., the first internal extension grooves IEG1, the second internal extension grooves IEG2, the first external extension grooves EEG1, and the second external extension grooves EEG2), the overall thickness of traditional circuit board can be reduced by more than 50%, which is beneficial to miniaturization and thinning of the electronic device (such as the smart phone).

Furthermore, the sidewalls (i.e., the inner surface S3 and the outer surface S4) of the annular interposer of the present disclosure can be selectively disposed with the plurality of electronic components (i.e., the interior electronic components 300 and the exterior electronic components 400) to improve the performance of the circuit board, and miniaturization and increase the functionality of the electronic device. Compared with circuit board formed by traditional welding methods, the circuit board of the present disclosure has the advantages of being easy to disassemble, repair, and replace the circuit base board and/or the annular interposer due to its snap-on design.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit board, comprising:

a first circuit base board, comprising:

a first interior region;

a first annular groove surrounding the first interior region, wherein the first annular groove has a plurality of first internal extension grooves extending toward the first interior region; and at least one first conductive layer disposed on a bottom surface and a sidewall of at least one of the plurality of first internal extension grooves;

a second circuit base board, comprising:

a second interior region;

a second annular groove surrounding the second interior region, wherein the second annular groove has a plurality of second internal extension grooves extending toward the second interior region; and at least one second conductive layer disposed on a bottom surface and a sidewall of at least one of the plurality of second internal extension grooves;

an annular interposer disposed between the first circuit base board and the second circuit base board and located in the first annular groove and the second annular groove; and a conductive element disposed in one of the plurality of first internal extension grooves and one of the plurality of second internal extension grooves, wherein the conductive element electrically connects to the first conductive layer and the second conductive layer.

2. The circuit board of claim 1, wherein the first circuit base board further comprises a magnet, the first interior region comprises a first recess, and the magnet is disposed in the first recess.

3. The circuit board of claim 2, wherein the magnet is a permanent magnet.

4. The circuit board of claim 2, wherein the first circuit base board further comprises a shielding material, and the shielding material is disposed between the first recess and the magnet.

5. The circuit board of claim 4, wherein the shielding material comprises a ferromagnetic material or a ferrimagnetic material.

6. The circuit board of claim 2, wherein the second circuit base board further comprises a magnetically attractive body, the second interior region comprises a second recess, the magnetically attractive body is disposed in the second recess, and the magnet and the magnetically attractive body are arranged opposite to each other, wherein a magnetic force is generated between the magnet and the magnetically attractive body to attract each other.

7. The circuit board of claim 6, wherein the magnetically attractive body is a permanent magnet or comprises a ferromagnetic material or a ferrimagnetic magnetic material that is not spontaneously magnetized.

8. The circuit board of claim 1, wherein the first circuit base board further comprises a first exterior region surrounding the first interior region and the first annular groove, the second circuit base board further comprises a second exterior region surrounding the second interior region and the second annular groove, and wherein the first annular groove has a plurality of first external extension grooves extending toward the first exterior region, and the second annular groove has a plurality of second external extension grooves extending toward the second exterior region.

9. The circuit board of claim 8, wherein the annular interposer has an inner surface surrounding the first interior region and the second interior region, and the first exterior region and the second exterior region surround the inner surface, and wherein the circuit board further comprises a plurality of interior electronic components, and the plurality of interior electronic components are disposed in the plurality of first internal extension grooves and the plurality of second internal extension grooves.

10. The circuit board of claim 9, wherein the annular interposer further has an outer surface surrounding the inner surface, and the first exterior region and the second exterior region surround the outer surface, and wherein the circuit board further comprises a plurality of exterior electronic components, and the plurality of exterior electronic components are disposed in the plurality of first external extension grooves and the plurality of second external extension grooves.

11. The circuit board of claim 9, wherein the first interior region of the first circuit base board, the second interior region of the second circuit base board, and the inner surface of the annular interposer form a cavity.

12. A manufacturing method of a circuit board, comprising:

providing the first circuit base board of claim 1;

providing the second circuit base board of claim 1;

forming an annular interposer, wherein forming the annular interposer comprises:

providing a wiring base board, wherein the wiring base board has a first surface and a second surface opposite to the first surface;

disposing a conductive element on the first surface;

recessing a portion of the wiring base board from the first surface to form a plurality of wiring recesses; and bending the plurality of wiring recesses, so that the wiring base board forms the annular interposer, wherein the first surface forms an inner surface, the second surface forms an outer surface, and the outer surface surrounds the inner surface;

placing the annular interposer between the first circuit base board and the second circuit base board, so that the conductive element is disposed in one of the plurality of first internal extension grooves and one of the plurality of second internal extension grooves, wherein the conductive element electrically connects to the first conductive layer and the second conductive layer.

13. The manufacturing method of the circuit board of claim 12, wherein forming the annular interposer further comprises:

disposing a plurality of interior electronic components on the first surface; and disposing a plurality of exterior electronic components on the second surface.

14. The manufacturing method of the circuit board of claim 12, wherein the first circuit base board further comprises a magnet, the first interior region comprises a first recess, and the magnet is disposed in the first recess.

15. The manufacturing method of the circuit board of claim 14, wherein the first circuit base board further comprises a shielding material, and the shielding material is disposed between the first recess and the magnet.

16. The manufacturing method of the circuit board of claim 14, wherein the second circuit base board further comprises a magnetically attractive body, the second interior region comprises a second recess, the magnetically attractive body is disposed in the second recess, and the magnet and the magnetically attractive body are arranged opposite to each other, wherein a magnetic force is generated between the magnet and the magnetically attractive body to attract each other.

* * * * *